United States Patent
Darolia et al.

(10) Patent No.: US 6,579,627 B1
(45) Date of Patent: Jun. 17, 2003

(54) NICKEL-BASE SUPERALLOY WITH MODIFIED ALUMINIDE COATING, AND ITS PREPARATION

(75) Inventors: Ramgopal Darolia, West Chester, OH (US); Robert A. Miller, Brecksville, OH (US); Ronald D. Noebe, Medina, OH (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/564,120

(22) Filed: May 3, 2000

Related U.S. Application Data

(63) Continuation-in-part of application No. 09/166,883, filed on Oct. 6, 1998, now Pat. No. 6,153,313.

(51) Int. Cl.[7] .............................. B32B 15/04; F03B 3/12
(52) U.S. Cl. ........................ 428/632; 428/652; 428/668; 428/680; 416/241 R
(58) Field of Search .................. 428/632, 633, 428/650, 652, 668, 678, 680; 416/241 R

(56) References Cited

U.S. PATENT DOCUMENTS

| | | | | |
|---|---|---|---|---|
| 3,754,902 A | * | 8/1973 | Boone et al. | 75/171 |
| 4,758,480 A | * | 7/1988 | Hecht et al. | 428/680 |
| 5,683,825 A | * | 11/1997 | Bruce et al. | 428/698 |
| 6,153,313 A | * | 11/2000 | Rigney et al. | 428/632 |

\* cited by examiner

Primary Examiner—Deborah Jones
Assistant Examiner—Jennifer McNeil
(74) Attorney, Agent, or Firm—Gregory Garmong; Jonathan P. Miller; McNees Wallace & Nurick LLC

(57) ABSTRACT

A nickel-base superalloy article has a protective layer on a surface of the substrate. The protective layer has a composition including nickel, aluminum, and at least two modifying elements selected from the group consisting of zirconium, hafnium, yttrium, and silicon. The protective layer is preferably predominantly beta (β) phase NiAl composition. Each of the modifying elements which is present is included in an amount of from about 0.1 to about 5 percent by weight of the protective layer in the case of zirconium, hafnium, and silicon modifying element, and in an amount of from about 0.1 to about 1 percent by weight of the protective layer in the case of yttrium modifying element.

14 Claims, 2 Drawing Sheets

NICKEL-BASE SUPERALLOY WITH MODIFIED ALUMINIDE COATING, AND ITS PREPARATION

This application is a continuation-in-part of application Ser. No. 09/166,883, filed Oct. 6, 1998, now U.S. Pat. No. 6,153,313, for which priority is claimed.

BACKGROUND OF THE INVENTION

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of combustion gas turns the turbine by impingement against an airfoil section of the turbine blades and vanes, which turns the shaft and provides power to the compressor and the fan. The hot exhaust gases flow from the back of the engine, driving it and the aircraft forwardly.

The hotter the combustion and exhaust gases, the more efficient is the operation of the jet engine. There is thus an incentive to raise the combustion and exhaust gas temperatures. The maximum temperature of the combustion gases is normally limited by the materials used to fabricate the turbine vanes and turbine blades of the gas turbine, upon which the hot combustion gases impinge. In current engines, the turbine vanes and blades are made of nickel-based superalloys, and can operate at temperatures of up to about 1800–2100° F.

Many approaches have been used to increase the operating temperature limit and service lives of the turbine blades and vanes to their current levels. For example, the composition and processing of the base materials themselves have been improved. Cooling techniques are used, as for example providing the component with internal cooling passages through which cooling air is flowed.

In another approach, the surfaces of the turbine blades and vanes are coated with aluminum-containing protective layers that protect the articles against the combustion gas, and in some cases insulate the articles from the temperature of the combustion gas. For example, overlay aluminide coatings may be used on the surfaces of the articles. A ceramic layer may also overlie the protective layer on the surface. The articles are thereby able to run cooler and be more resistant to environmental attack.

Although all of these approaches are effective to improve the performance of gas turbines, there is an opportunity for additional improvements to extend the operating temperatures and service lives of the gas turbine components. There is a need for improved protective coating systems that extend the capabilities of the turbine components even further. The present invention fulfills this need, and further provides related advantages.

BRIEF SUMMARY OF THE INVENTION

The present invention provides a nickel-base superalloy article protected by a protective layer, and a method for its preparation. The article is particularly useful as a gas turbine blade or vane. The article has a prolonged life in the thermal cycling conditions found in aircraft engine operation, as compared with conventional articles.

A nickel-base superalloy article protected by a protective layer comprises an article substrate having a surface and comprising a nickel-base superalloy, and a protective layer on the surface of the article substrate. The article substrate is preferably in the shape of a gas turbine component, most preferably a gas turbine blade or a gas turbine vane. The protective layer comprises nickel, aluminum, and at least two modifying elements selected from the group consisting of zirconium, hafnium, yttrium, and silicon. It is preferred that one of the modifying elements is zirconium, and the additional modifying elements are selected from the group consisting of hafnium, yttrium, and silicon. Each of the modifying elements zirconium, hafnium, and silicon which is present is included in the protective layer in an amount of from about 0.1 to about 5 (more preferably from about 0.1 to about 3 and most preferably from about 0.1 to about 1) percent by weight of the protective layer. The modifying element yttrium, where present, is included in the protective layer in an amount of from about 0.1 to about 1 percent by weight of the protective layer. The protective layer is preferably an overlay coating such as a predominantly beta ($\beta$) phase NiAl composition, but it may be an overlay coating such as MCrAlX or a diffusion aluminide. Optionally, a ceramic layer may overlie the protective layer.

The protective layer desirably comprises from about 20 to about 35 weight percent aluminum, nickel, the at least two modifying elements, and possibly other elements interdiffused from the substrate. The protective layer is from about 0.0005 inch to about 0.004 inch thick.

The article is preferably prepared with an overlay coating by providing a substrate having a surface and comprising a nickel-base superalloy, and depositing a protective layer onto the surface of the substrate by a physical vapor deposition process. The layer comprises aluminum, nickel, and at least two modifying elements selected from the group consisting of zirconium, hafnium, yttrium, and silicon. Each of the modifying elements zirconium, hafnium, and silicon which is present is included in the protective layer in an amount of from about 0.1 to about 5 (more preferably from about 0.1 to about 3 and most preferably from about 0.1 to about 1) percent by weight of the protective layer. The modifying element yttrium, where present, is included in the protective layer in an amount of from about 0.1 to about 1 percent by weight of the protective layer.

It has been determined that the addition of a combination of two or more of the modifying elements zirconium, hafnium, yttrium, and silicon provide an improvement to the furnace cycle testing life of the protected article that is greater than is predicted based on simple additive effects. Accordingly, the use of only one such modifying element is expressly excluded from the scope of the invention. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
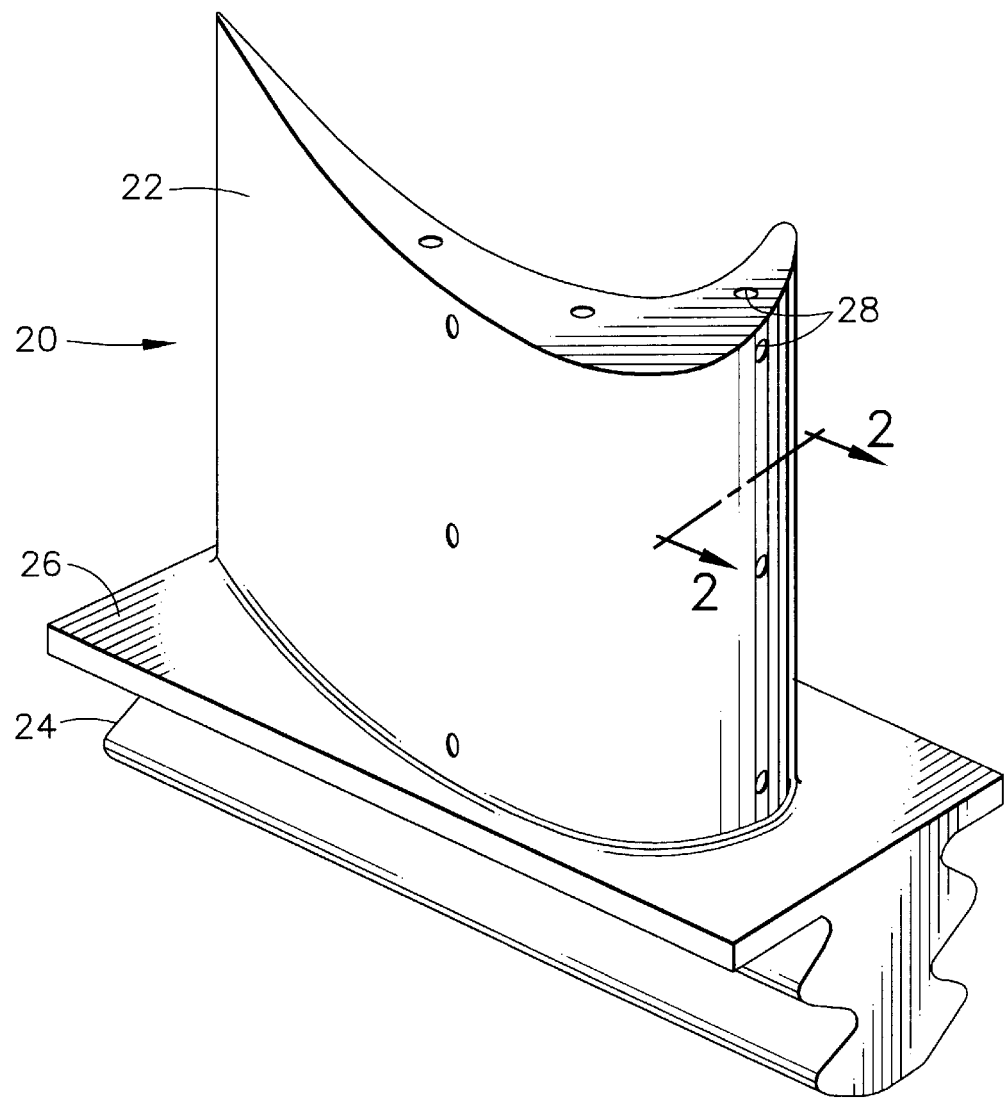
FIG. 1 is a perspective view of a turbine blade.

FIG. 1 depicts a component article of a gas turbine engine such as a turbine blade or turbine vane, and in this illustration a turbine blade 20. The turbine blade 20 is formed of a nickel-base superalloy. The turbine blade 20 includes an airfoil 22 against which the flow of hot exhaust gas is directed. (The turbine vane has a similar appearance in respect to the pertinent airfoil portions.) The turbine blade 20 is mounted to a turbine disk (not shown) by a dovetail 24 which extends downwardly from the airfoil 22 and engages a slot on the turbine disk. A platform 26 extends laterally outwardly from the area where the airfoil 22 is joined to the dovetail 24. A number of internal passages extend through the interior of the airfoil 22, ending in openings 28 in the surface of the airfoil 22. A flow of cooling air is directed through the internal passages, to reduce the temperature of the airfoil 22.

Figure 2:
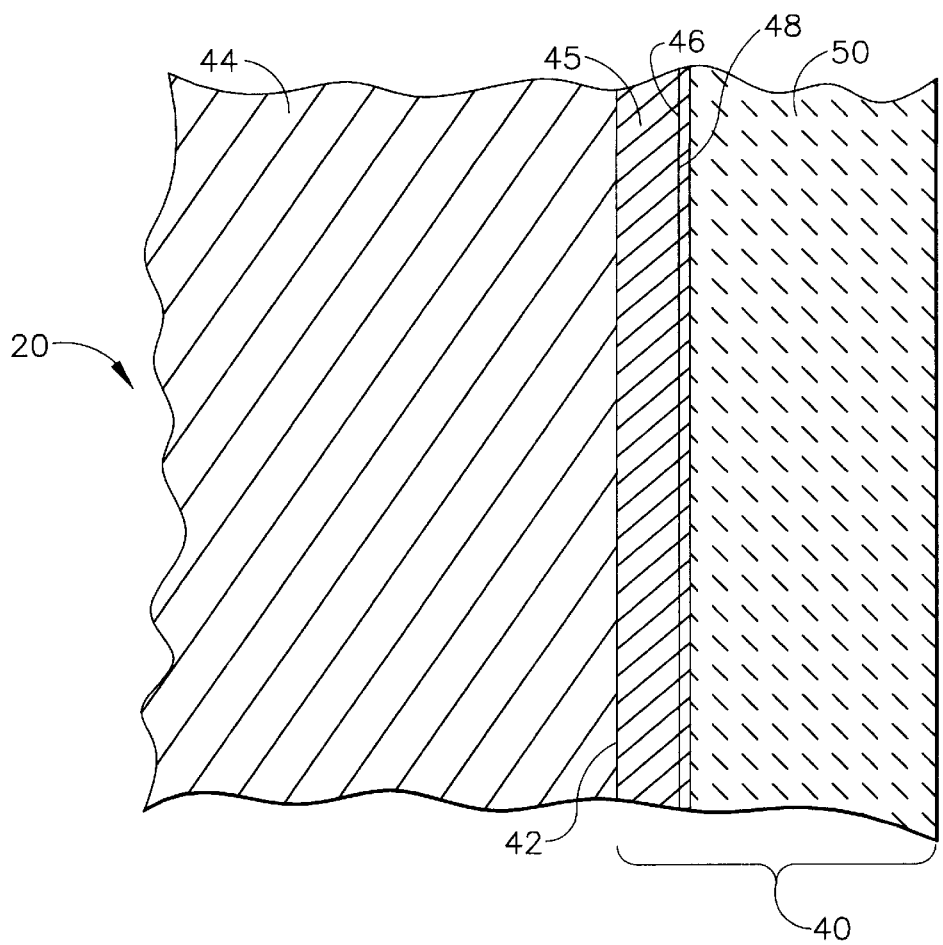
FIG. 2 is an enlarged schematic sectional view through the turbine blade of FIG. 1, taken on lines 2—2.

FIG. 2 is a longitudinal section through the airfoil 22, which serves as a substrate 42 and has an airfoil surface 38. A protective coating 44 overlies and contacts the airfoil surface 38. The protective coating 44 includes a protective layer 46 overlying and contacting the airfoil surface 38.

The protective layer 46 is preferably an aluminide overlay coating, most preferably a predominantly beta (β) phase NiAl overlay coating. The stoichiometric composition of the beta NiAl phase is about 50 atomic percent (about 31.4 weight percent) aluminum, with the balance nickel. The beta phase has a relatively wide composition range, from a hypostoichiometric composition of about 20 weight percent (35 atomic percent) aluminum to a hyperstoichiometric composition of about 35 weight percent (55 atomic percent) aluminum. Thus, the allowable composition range is from about 20 to about 35 weight percent aluminum. Narrower ranges are preferred in specific applications. Specifically, the range of from about 22 to about 30 weight percent aluminum is preferred, and the range of from about 22 to about 27 weight percent aluminum is most preferred. As used herein, "predominantly" means that the overlay coating exceeds about 90 percent by volume of the β-phase NiAl.

The protective layer 46, preferably in an overlay form such as predominantly beta (β) phase NiAl overlay coating, also includes at least two members of the group consisting of zirconium, hafnium, yttrium, and silicon. These elements are incorporated as modifying elements into the protective layer 46. Preferably, at least one of the modifying elements is zirconium, and the others are selected from the group consisting of hafnium, yttrium, and silicon. Each of the modifying elements zirconium, hafnium, and silicon which is present is included in the protective layer in an amount of from about 0.1 to about 5 (more preferably from about 0.1 to about 3 and most preferably from about 0.1 to about 1) percent by weight of the protective layer. The modifying element yttrium, where present, is included in the protective layer in an amount of from about 0.1 to about 1 percent by weight of the protective layer. That is, at least two of the group must be present, and each one that is present has a concentration in the specified weight range. During deposition processing, a separate step, and/or service of the component article at elevated temperature, an outer surface of the protective layer 46 is oxidized to form a protective aluminum oxide ($Al_2O_3$) layer, sometimes termed a "scale". This protective aluminum oxide layer inhibits and slows subsequent corrosion and oxidation damage at the airfoil surface 38.

The presence of the two or more modifying elements achieves improved performance of the aluminide protective layer 46, primarily by improved adherence of the protective aluminum oxide to the surface of the substrate. These modifying elements are believed to achieve the improved adherence by providing "pegs" to anchor the protective aluminum oxide to the surface of the substrate, by increasing the strength of the protective layer 46, and in some cases by improving the strength of the interface between the protective aluminum oxide and the substrate 42. The operability of the invention is not dependent upon these possible explanations. If the amount of each modifying element is, on average, less than about 0.1 weight percent, it is ineffective in achieving improved performance of the aluminide protective layer 46, as compared with an otherwise similar aluminide which does not contain the modifying element. If the amount of each modifying element is, on average, greater than the above-specified limits in the aluminide protective layer 46, there is a risk of adverse effects on the environmental properties of the aluminide protective layer 46 and of the metallurgical properties of the substrate 42.

The average aluminum content of the aluminide protective layer 46 is from about 20 to about 35 percent by weight. If the average aluminum content is less than about 20 percent by weight of the aluminide protective layer 46, the protective oxide is not formed properly. If the average aluminum content is greater than about 35 percent by weight of the aluminide protective layer 46, the coating may become brittle and can, in turn, initiate cracking of the substrate 42. The remainder of the protective layer 46, which is not aluminum and not the modifying element, is nickel and elements diffused into the layer 46 from the substrate 42 and which do not interfere with the functioning of the modifying elements.

The protective layer 46 may instead be another type of overlay coating modified according to the invention, such as an MCrAlX coating, or a diffusion aluminide coating, such as a diffusion nickel aluminide or platinum-modified diffusion aluminide, but these alternatives are not preferred.

Optionally, a ceramic layer 48 overlies and contacts the protective layer 46. The ceramic layer 48 is preferably yttria-stabilized zirconia, which is zirconium oxide containing from about 2 to about 12 weight percent, preferably from about 3 to about 8 weight percent, of yttrium oxide. The ceramic layer 48 is typically from about 0.003 to about 0.010 inch thick. Other operable ceramic materials may be used as well. When there is no ceramic layer 48 present, the protective layer 46 is termed an "environmental coating". When there is a ceramic layer 48 present, the protective layer 46 is termed a "bond coat".

Figure 3:
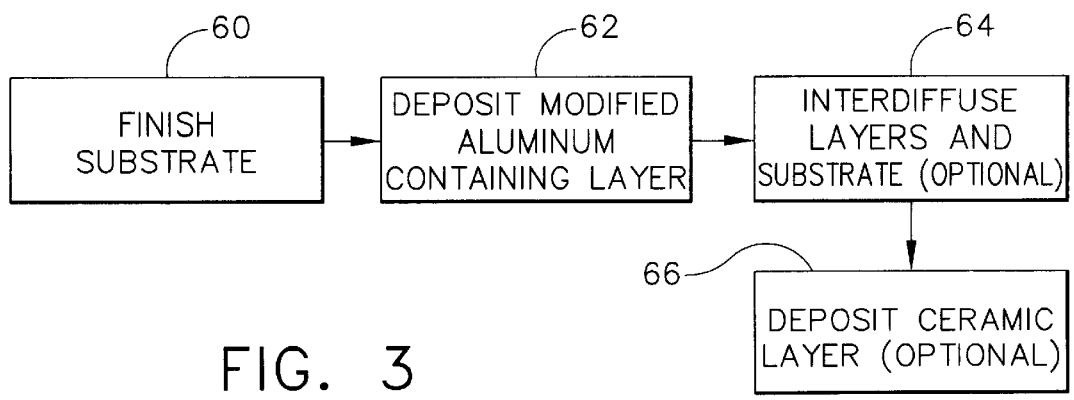
FIG. 3 is a block flow diagram of an approach for preparing a coated gas turbine airfoil.

FIG. 3 is a block diagram of an approach for practicing the present invention. An article substrate 42 is provided, numeral 60. The article substrate is preferably the airfoil 22 of FIG. 1, either as a turbine blade or turbine vane. The article substrate includes the airfoil surface 38. The airfoil (and all of the turbine blade or turbine vane) may be made of any operable base-metal alloy material, with a nickel-base superalloy being preferred. As used herein, "nickel-base" means that the composition has more nickel present than any other element. The nickel-base superalloys are typically of a composition that is strengthened by the precipitation of gamma-prime phase. The preferred nickel-base alloy has a composition, in weight percent, of from about 4 to about 20 percent cobalt, from about 1 to about 10 percent chromium, from about 5 to about 7 percent aluminum, from 0 to about 2 percent molybdenum, from about 3 to about 8 percent tungsten, from about 4 to about 12 percent tantalum, from 0 to about 2 percent titanium, from 0 to about 8 percent rhenium, from 0 to about 6 percent ruthenium, from 0 to about 1 percent niobium, from 0 to about 0.1 percent carbon, from 0 to about 0.01 percent boron, from 0 to about 0.1 percent yttrium, from 0 to about 1.5 percent hafnium, balance nickel and incidental impurities.

A most preferred alloy composition is Rene' N5, which has a nominal composition in weight percent of about 7.5 percent cobalt, about 7 percent chromium, about 6.2 percent aluminum, about 6.5 percent tantalum, about 5 percent tungsten, about 1.5 percent molybdenum, about 3 percent rhenium, about 0.05 percent carbon, about 0.004 percent boron, about 0.15 percent hafnium, up to about 0.01 percent yttrium, balance nickel and incidental impurities. Other operable superalloys include, for example, Rene' N6, which has a nominal composition in weight percent of about 12.5 percent cobalt, about 4.2 percent chromium, about 1.4 percent molybdenum, about 5.75 percent tungsten, about 5.4 percent rhenium, about 7.2 percent tantalum, about 5.75 percent aluminum, about 0.15 percent hafnium, about 0.05 percent carbon, about 0.004 percent boron, about 0.01 percent yttrium, balance nickel and incidental impurities; CMSX-4, which has a nominal composition in weight percent of about 9.60 percent cobalt, about 6.6 percent chromium, about 0.60 percent molybdenum, about 6.4 percent tungsten, about 3.0 percent rhenium, about 6.5 percent tantalum, about 5.6 percent aluminum, about 1.0 percent titanium, about 0.10 percent hafnium, balance nickel and incidental impurities; CMSX-10, which has a nominal composition in weight percent of about 7.00 percent cobalt, about 2.65 percent chromium, about 0.60 percent molybdenum, about 6.40 percent tungsten, about 5.50 percent rhenium, about 7.5 percent tantalum, about 5.80 percent aluminum, about 0.80 percent titanium, about 0.06 percent hafnium, about 0.4 percent niobium, balance nickel and incidental impurities; PWA1480, which has a nominal composition in weight percent of about 5.00 percent cobalt, about 10.0 percent chromium, about 4.00 percent tungsten, about 12.0 percent tantalum, about 5.00 percent aluminum, about 1.5 percent titanium, balance nickel and incidental impurities; PWA 1484, which has a nominal composition in weight percent of about 10.00 percent cobalt, about 5.00 percent chromium, about 2.00 percent molybdenum, about 6.00 percent tungsten, about 3.00 percent rhenium, about 8.70 percent tantalum, about 5.60 percent aluminum, about 0.10 percent hafnium, balance nickel and incidental impurities; and MX-4, which has a nominal composition as set forth in U.S. Pat. No. 5,482,789, in weight percent, of from about 0.4 to about 6.5 percent ruthenium, from about 4.5 to about 5.75 percent rhenium, from about 5.8 to about 10.7 percent tantalum, from about 4.25 to about 17.0 percent cobalt, from 0 to about 0.05 percent hafnium, from 0 to about 0.06 percent carbon, from 0 to about 0.01 percent boron, from 0 to about 0.02 percent yttrium, from about 0.9 to about 2.0 percent molybdenum, from about 1.25 to about 6.0 percent chromium, from 0 to about 1.0 percent niobium, from about 5.0 to about 6.6 percent aluminum, from 0 to about 1.0 percent titanium, from about 3.0 to about 7.5 percent tungsten, and wherein the sum of molybdenum plus chromium plus niobium is from about 2.15 to about 9.0 percent, and wherein the sum of aluminum plus titanium plus tungsten is from about 8.0 to about 15.1 percent, balance nickel and incidental impurities. The use of the present invention is not limited to these preferred alloys, and has broader applicability.

The protective layer 46 is deposited overlying and contacting the surface 38, numeral 62. The protective layer 46, which is preferably predominantly beta (β) phase NiAl overlay coating, is preferably deposited by any operable physical vapor deposition technique, such as electron beam physical vapor deposition, sputtering, or cathodic arc, or by air or low-pressure plasma spray. The predominantly beta (β) phase NiAl protective layer 46 is preferably from about 0.0005 to about 0.004 inch, most preferably about 0.002 inch, thick.

The overlay protective coating 44 optionally includes the ceramic layer 48, deposited overlying and contacting the protective layer 46. The ceramic layer 48 is preferably from about 0.003 to about 0.010 inch thick, most preferably about 0.005 inch thick. (FIG. 2 is not drawn to scale.) The ceramic layer 48 is preferably yttria-stabilized zirconia, which is zirconium oxide containing from about 2 to about 12 weight percent, preferably from about 3 to about 8 weight percent, of yttrium oxide. Other operable ceramic materials may be used as well. It may be deposited, numeral 64, by any operable technique, such as physical vapor deposition or plasma spray.

To demonstrate the approach of the present invention, button specimens were prepared for furnace cycle testing (FCT). Argon-atomized powders of the appropriate compositions as set forth in the following table were obtained and hot isostatically pressed onto bar stock at a temperature of about 2300° F. and a pressure of about 20,000 pounds per square inch for 4 hours. Specimens about 1 inch in diameter and ⅛ inch were cut from the bar stock. A ceramic layer was deposited over the protective layer in each case. The ceramic layer was yttria-stabilized zirconia having a thickness of about 0.005 inch. The ceramic layer was deposited by one of two techniques, electron beam physical vapor deposition (EB-PVD), whose results are presented in the second column of the table, or air plasma spray (APS), whose results are presented in the third column of the table. Furnace cycle testing included cycling the specimens using a cycle with the steps of heating from room temperature to 2125° F. in about 5 minutes, holding at 2125° F. for about 50 minutes, and cooling to room temperature in about 5 minutes. The specimens were periodically inspected visually. The life of the specimen was defined for this test as the number of cycles required for about 20 percent of the surface area of the coating to fail by spallation.

The following table reports the observations on FCT life. In the second and third columns, there are two numbers, the first being the number of cycles to failure and the second being the number of specimens tested. The results were averaged to obtain the first number in each column, where there was more than one specimen. A plus sign means that the specimen did not fail in the indicated number of cycles.

| Composition (atomic %) | Cycles (no. spec.) EB-PVD Ceramic | Cycles (no. spec.) APS Ceramic |
|---|---|---|
| 50Ni-50Al | 60 (1) | 200 (2) |
| 50Ni-49.9Al-0.1Hf | 50 (2) | 195 (4) |
| 50Ni-49.9 Al-0.1Zr | 70 (2) | 200 (4) |
| 50Ni-49.9Al-0.1Y | 260 (2) | 595 (4) |
| 50Ni-49.9Al-0.1Si | 40 (1) | 210 (2) |
| 50Ni-49.8Al-0.1Hf-0.1Zr | 5860+ (1) | 640 (2) |
| 50Ni-49.8Al-0.1Y-0.1Zr | 1360 (1) | 750 (2) |
| 50Ni-49.8Al-0.1Y-0.1Si | 340 (1) | 510 (2) |
| 50Ni-49.7Al-0.1Hf-0.1Zr-0.1Y | 3180 (1) | 490 (2) |
| 50Ni-49.6Al-0.1Hf-0.1Zr-0.1Y-0.1Si | 1140 (1) | 490 (2) |
| 50Ni-49.7Al-0.1Hf-0.1Zr-0.1Si | 5860+ (1) | 340 (2) |

The specimens whose protective layer had two or more of the modifying elements zirconium, hafnium, yttrium, and silicon had surprisingly and unexpectedly greater FCT performance than those specimens having only a single modifying element in the protective layer. This improvement is by a factor of several times, not simply an additive effect. Particularly good results were obtained where at least one of the two-or-more modifying elements was zirconium, and where there are at least three modifying elements present. These results are completely surprising and unexpected, as there is no basis for expecting that the effects will be synergistic rather than simply additive.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A nickel-base superalloy article protected by a protective layer, comprising:
    a substrate having a surface and comprising a nickel-base superalloy; and
    a protective layer on the surface of the substrate, the protective layer comprising a predominantly beta (β) phase NiAl composition having nickel, from about 20 to about 35 weight percent aluminum, at least two modifying elements selected from the group consisting of zirconium, hafnium, yttrium, and silicon, and other elements interdiffused from the substrate, wherein
        each of the modifying elements zirconium, hafnium, and silicon which is present is included in the protective layer in an amount of from about 0.1 to about 5 percent by weight of the protective layer, and
        the modifying element yttrium, where present, is included in the protective layer in an amount of from about 0.1 to about 1 percent by weight of the protective layer.

2. The article of claim 1, wherein
    each of the modifying elements zirconium, hafnium, and silicon which is present is included in the protective layer in an amount of from about 0.1 to about 3 percent by weight of the protective layer, and
    the modifying element yttrium, where present, is included in the protective layer in an amount of from about 0.1 to about 1 percent by weight of the protective layer.

3. The article of claim 1, wherein the at least two modifying elements includes zirconium and at least one additional modifying element selected from the group consisting of hafnium, yttrium, and silicon.

4. The article of claim 1, wherein the protective layer comprises from about 22 to about 30 weight percent aluminum.

5. The article of claim 1, wherein the protective layer is from about 0.0005 inch to about 0.004 inch thick.

6. The article of claim 1, further including
    a ceramic layer overlying the protective layer.

7. The article of claim 1, wherein the substrate has a shape of a gas turbine component.

8. The article of claim 1, wherein at least three of the modifying elements are present.

9. The article of claim 1, wherein one of the modifying elements is zirconium.

10. A nickel-base superalloy article protected by a protective layer, comprising:
    a substrate having a surface and comprising a nickel-base superalloy; and
    a protective layer on the surface of the substrate comprising a predominantly beta (β) phase NiAl composition having therein at least two modifying elements selected from the group consisting of zirconium, hafnium, yttrium, and silicon, and other elements interdiffused from the substrate, wherein
        each of the modifying elements zirconium, hafnium, and silicon which is present is included in the protective layer in an amount of from about 0.1 to about 5 percent by weight of the protective layer, and
        the modifying element yttrium, where present, is included in the protective layer in an amount of from about 0.1 to about 1 percent by weight of the protective layer.

11. The article of claim 10, wherein at least three of the modifying elements are present.

12. The article of claim 10, wherein one of the modifying elements is zirconium.

13. A nickel-base superalloy article protected by a protective layer, comprising:
    a substrate having a surface and comprising a nickel-base superalloy; and
    a protective layer on the surface of the substrate, the protective layer comprising nickel, aluminum, and at least three modifying elements selected from the group consisting of zirconium, hafnium, yttrium, and silicon, and other elements interdiffused from the substrate, wherein
        each of the modifying elements zirconium, hafnium, and silicon which is present is included in the protective layer in an amount of from about 0.1 to about 5 percent by weight of the protective layer, and
        the modifying element yttrium, where present, is included in the protective layer in an amount of from about 0.1 to about 1 percent by weight of the protective layer.

14. The article of claim 13, wherein one of the modifying elements is zirconium.

* * * * *